United States Patent [19]

Mahant-Shetti et al.

[11] Patent Number: 5,723,988
[45] Date of Patent: Mar. 3, 1998

[54] CMOS WITH PARASITIC BIPOLAR TRANSISTOR

[75] Inventors: Shivaling S. Mahant-Shetti, Richardson; Mark G. Harward; Lawrence A. Arledge, Jr., both of Dallas; Ravishankar Sundaresan, Carrollton, all of Tex.

[73] Assignee: Texas Instruments Incorporated, Dallas, Tex.

[21] Appl. No.: 139,490

[22] Filed: Oct. 20, 1993

[51] Int. Cl.⁶ .................... H03K 19/08; H03K 19/0948
[52] U.S. Cl. .................... 326/85; 327/544; 326/103
[58] Field of Search .................... 307/443, 446, 307/451; 257/337, 370, 378; 326/83, 84–85, 110, 121, 15, 17; 327/534, 544

[56] References Cited

U.S. PATENT DOCUMENTS

| | | | |
|---|---|---|---|
| 4,441,117 | 4/1984 | Zommer | 257/378 |
| 4,465,945 | 8/1984 | Yin | 307/451 |
| 4,675,561 | 6/1987 | Bowers | 257/378 |
| 5,004,936 | 4/1991 | Andresen | 307/451 |
| 5,140,190 | 8/1992 | Yoo et al. | 307/446 |
| 5,241,194 | 8/1993 | Baliga | 257/370 |

*Primary Examiner*—Edward P. Westin
*Assistant Examiner*—Jon Santamauro
*Attorney, Agent, or Firm*—Peter T. Rutkowski; Richard L. Donaldson; William E. Hiller

[57] ABSTRACT

A device is disclosed which combines the advantages of CMOS and bipolar using an existing parasitic bipolar device. As such high on-chip density is attainable with the device along with high speed capability while maintaining low power advantages.

6 Claims, 1 Drawing Sheet

CMOS WITH PARASITIC BIPOLAR TRANSISTOR

BACKGROUND OF THE INVENTION

Low power with high current would be generally desirable traits for integrated circuit devices. For a field effect transistor fabricated as an integrated circuit device on a semiconductor substrate, a parasitic transistor inherently exists in the semiconductor substrate. FIG. 1 illustrates field effect transistor 2 and its parasitic bipolar transistor 4. The collector and emitter of bipolar transistor 4 are connected to a respective drain/source of field effect transistor 2. It would be particularly beneficial if the low power advantage of complementary metal oxide semiconductor (CMOS) devices could be combined with the relatively high current advantage of the parasitic bipolar transistor associated with field effect transistors of a CMOS device. The two have not been previously combined until now.

SUMMARY OF THE INVENTION

An electronic device is provided comprising a first field effect transistor, a second field effect transistor and a bipolar transistor. The collector and emitter of the bipolar transistor are connected to a respective drain/source of the first field effect transistor. The collector and base of the bipolar transistor is connected to a respective drain/source of the second field effect transistor and the gates of the field effect transistors are connected together.

DETAILED DESCRIPTION OF THE INVENTION

The invention provides enhanced transistor performance and efficiency.

Figure 2:
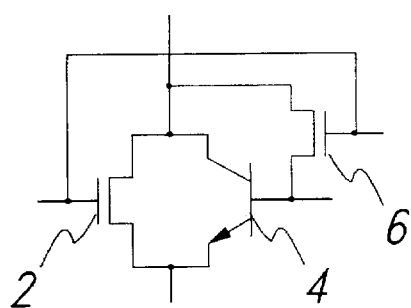
FIG. 2 illustrates a schematic drawing of a first embodiment of the invention.

With reference to the schematic drawing illustrated in FIG. 2, in a first preferred embodiment of the invention, the performance and efficiency of the transistor action associated with field effect transistor 2 is enhanced by use of bipolar parasitic transistor 4 connected at its collector and emitter to a respective drain/source of transistor 2. A drain/source of field effect transistor 6 is connected to the base of transistor 4 while the other drain/source of field effect transistor 6 is connected to the drain/source of field effect transistor 2. The gates of transistors 2 and 6 are connected together.

Figure 3:
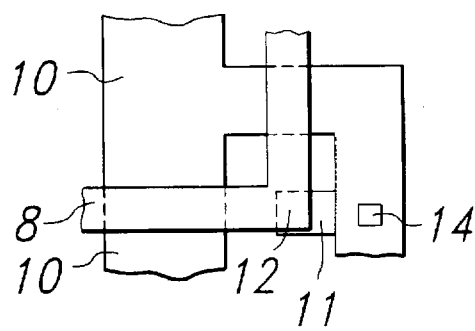
FIG. 3 illustrates a top view of that shown in FIG. 2 fabricated as an integrated circuit device.

FIG. 3 illustrates a top view of the foregoing discussed circuit elements fabricated as an integrated circuit. Gate 8 overpasses drain/source regions 10. Drain/source regions 10 can also serve as an emitter or a collector of bipolar transistor 4 shown in FIG. 2. Base region 12 underlies gate 8 and is connected to a drain/source region 10 through interconnect 14. The actual interconnection of base region 12 to a drain/source region 10 can be made, for instance, by silicide.

Figure 1:
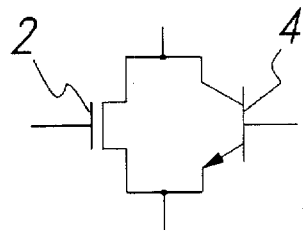
FIG. 1 illustrates a schematic drawing of a field effect transistor and its parasitic bipolar transistor.
Figure 4:
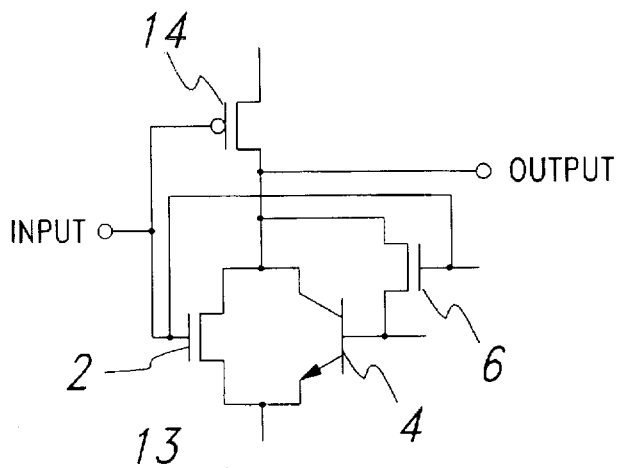
FIG. 4 illustrates inverter made according to the invention.
Figure 5:
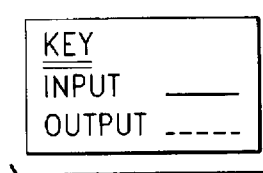
FIG. 5 illustrates a graph of inverter input and inverter output vs. time.

There are many advantages associated with the use of the foregoing described structure shown in FIGS. 2 and 3. For instance, FIG. 4 illustrates inverter 13, including load transistor 14. Preferably, load transistor 14 is a p-channel transistor as is illustrated. A drive transistor, shown here as a n-channel transistor 2, is active after the voltage at its gate (and thus the input of the inverter) has transitioned from a logic low to a logic high level (assuming an enhancement mode transistor). As shown in the graph of inverter input and inverter output vs. time in FIG. 5, after the input has transitioned from a logic low to a logic high, under heavily loaded conditions, there is a portion of time during which the output of the inverter remains at a logic high level. During this portion of time, transistor 6 conducts and turns bipolar transistor 4 on. Transistor 2 conducts to discharge the load charge and continues to do so even after trnsistor 4 is off at $V_{out}$ (where $V_{out}$ is the output voltage)=$V_{sat}$ where $V_{sat}$ is the saturation voltage between the collector and emitter of bipolar transistor 4). Switching speed of an inverter made according to the invention is increased by virtue of using parasitic bipolar transistor 4 to drop the voltage at the output of inverter 13. The advantages offered by the invention include the use of a smaller load device (as compared with a comparable conventional load transistor of a CMOS inverter) for a given drive while maintaining the low power advantage of CMOS.

Figure 6:
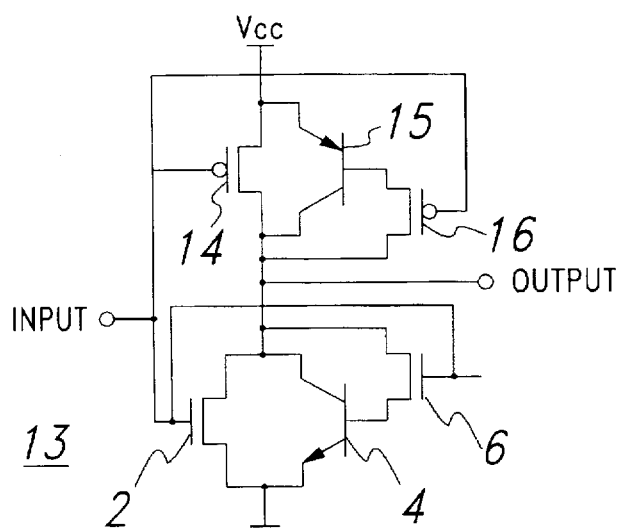
FIG. 6 illustrates a schematic drawing of the invention in which a parasitic bipolar transistor is used with both the drive and load transistors of an inverter.

Such assistance can be delivered for the other transition (low to high output) as well by making use of a pnp parasitic transistor associated with a p-channel load transistor. FIG. 6 illustrates a schematic drawing of the invention with such a modification, in which parasitic bipolar transistor 15 is used with load transistor Considering the input transition from high to low, as shown in the graph of inverter input and inverter output vs. time in FIG. 5, there is a portion of time during which the output of the inverter remains at a logic low level. During this portion of time, p-channel transistor 16 conducts and turns bipolar transistor 15 on. Transistor also conducts during this time and continues to conduct beyond the point when transistor 15 turns off. Switching speed of an inverter made according to the invention is increased by virtue of using parasitic bipolar transistor 15 to pull-up the voltage at the output of inverter 13.

The foregoing invention can be fabricated as an integrated circuit on a semiconductor, such as silicon, according to well known methods of semiconductor transistor fabrication. Further, the invention is particularly well suited for fabrication as a silicon-on-insulator (SOI) device. Since the field effect transistors are not required to provide all the current, they can be relatively small as compared with other transistors used in conjunction with the invention. For instance, transistors 6 and 16 of FIGS. 4 and 6 can be constructed of minimal width and length since the leakage between drain and source is likely inconsequential.

The foregoing described invention allows high on-chip density and results in high speed capability while maintaining its low power advantages. The invention is particularly useful for drive heavy loads.

Although the invention has been described in detail herein with reference to its preferred embodiment, it is to be understood that this description is by way of example only, and it is not to be construed in a limiting sense. It is further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed below.

We claim:

1. An inverter including:

a load field effect transistor and a drive field effect transistor, a drain/source of said load field effect transistor being connected to a drain/source of said drive field effect transistor;

a first field effect transistor;

a first bipolar transistor, wherein said first bipolar transistor is a parasitic bipolar transistor;

a first drain/source of said drive field effect transistor being connected to the collector of said first bipolar transistor, a second drain/source of said drive field effect transistor being connected to the emitter of said first bipolar transistor;

a first drain/source of said first field effect transistor being connected to the base of said first bipolar transistor;

a second drain/source of said first field effect transistor being connected to the collector of said first bipolar transistor;

the gate of said first field effect transistor being connected to the gate of said drive field effect transistor;

an input of said inverter is coupled to a gate of both said drive field effect transistor and a gate of said load field effect transistor; and an output of said inverter is coupled to said drain/source of said load field effect transistor.

2. A device as recited in claim 1 wherein said device is fabricated as an integrated circuit device.

3. A device as recited in claim 1 wherein said device is fabricated as a silicon-on-insulator integrated circuit device.

4. An inverter as recited in claim 1 which further includes a second bipolar transistor, wherein said second bipolar transistor is a parasitic bipolar transistor;

a second field effect transistor;

a first drain/source of said load field effect transistor being connected to the collector of said second bipolar transistor, a second drain/source of said load field effect transistor being connected to the emitter of said second bipolar transistor;

a first drain/source of said second field effect transistor being connected to the base of said second bipolar transistor;

a second drain/source of said second field effect transistor being connected to the collector of said second bipolar transistor; and the gate of said second field effect transistor being connected to the gate of said load field effect transistor.

5. A device as recited in claim 4 wherein said device is fabricated as a silicon-on-insulator integrated circuit device.

6. A device as recited in claim 4 wherein said device is fabricated as an integrated circuit device.

* * * * *